United States Patent
Tsai et al.

(10) Patent No.: US 11,343,110 B2
(45) Date of Patent: May 24, 2022

(54) PHANTOM OBJECT REPORTING IN A POWER-AND-GROUND ROUTER

(71) Applicant: Synopsys, Inc., Mountain View, CA (US)

(72) Inventors: Cheng-Hsiang Tsai, San Jose, CA (US); Yi-Min Jiang, Campbell, CA (US); Xiang Qiu, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 174 days.

(21) Appl. No.: 16/778,974

(22) Filed: Jan. 31, 2020

(65) Prior Publication Data

US 2020/0252227 A1 Aug. 6, 2020

(30) Foreign Application Priority Data

Feb. 1, 2019 (CN) .......................... 201910105906.2

(51) Int. Cl.
*H04L 12/10* (2006.01)
*H04L 41/0806* (2022.01)
*G06F 30/398* (2020.01)

(52) U.S. Cl.
CPC ............ *H04L 12/10* (2013.01); *G06F 30/398* (2020.01); *H04L 41/0806* (2013.01)

(58) Field of Classification Search
CPC ...... H04L 12/10; H04L 41/0806; G06F 30/39; G06F 30/392; G06F 30/394; G06F 30/398; G06F 30/347
USPC ........................................................ 716/110
See application file for complete search history.

(56) References Cited

U.S. PATENT DOCUMENTS

2010/0306720 A1* 12/2010 Pikus ..................... G06F 30/398
716/106
2019/0392110 A1* 12/2019 Huda ..................... G06F 30/398

FOREIGN PATENT DOCUMENTS

CN 111101176 A 5/2020

* cited by examiner

*Primary Examiner* — Paul Dinh
(74) *Attorney, Agent, or Firm* — Sterne, Kessler, Goldstein & Fox P.L.L.C.

(57) ABSTRACT

A method to report a phantom object for a structure in a power-and-ground (PG) router is disclosed. The method includes generating the structure of a PG network based on a spec received as input, identifying a violation of a design rule for the structure, and changing the structure to remove the violation of the design rule. The method further includes generating a report of the violation and the changing, generating a phantom object based on the changing, and outputting the report and the phantom object.

20 Claims, 11 Drawing Sheets

PHANTOM OBJECT REPORTING IN A POWER-AND-GROUND ROUTER

CROSS-REFERENCE TO RELATED APPLICATIONS

The present application claims priority under 35 U.S.C. § 119(a)-(d) to Chinese (PRC) Patent Application No. 201910105906.2 titled "Phantom wire/via reporting in correct-by-construction PG router," filed Feb. 1, 2019, which is hereby incorporated by reference in its entirety for all purposes.

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

SPECIFICATION—DISCLAIMERS

In the following Background, Summary, Detailed Description, and paragraph headings do not signify limitations. In these writings, the citation or identification of any publication signifies neither relevance nor status as prior art. Many paragraphs in this disclosure are common to multiple Synopsys patent specifications.

FIELD(S) OF TECHNOLOGY

The following information is solely for use in searching the prior art. This disclosure relates to the field of electronic design automation in general, including the area of phantom structure reporting for power-and-ground network creation.

BACKGROUND

With the advance of the technologies in Very Large Scale Integration (VLSI) circuit design, design rules and Power and Ground (PG) structures including wires and vias become increasingly sophisticated. PG network from user-defined spec may not be created completely by a correct-by-construction PG router (also referred to as "PG router") because it needs to resolve design rule violations (i.e. design rule check violations). Wires and vias may be modified or discarded by the PG router to resolve Design Rule Check (DRC) violations. The created different-than-expected PG network may have electrical potential difference (IR-drop) or electro-migration (i.e. EM) issues, which may cause chip performance and reliability problems. The designers may find generated PG network does not meet IR-drop or EM requirements using PG analysis tools at later implementation or sign-off stages. Accordingly, there is a need to assist the designers in debugging and fixing the problems to create the PG network.

SUMMARY

This Summary is a prelude to the Detailed Description. This Summary, together with the independent Claims, signifies a brief writing about at least one claimed embodiment (which can be a discovery, see 35 USC 100(a); and see 35 USC 100(j)), for use in commerce that is enabled by the Specification and Drawings.

The claims signify a brief description of one or more of the embodiments, and/or examples found within this disclosure.

This disclosure describes a method to report a phantom object for a structure in a PG router. The method may include generating the structure of a power and ground (PG) network based on a spec received as input, identifying a violation of a design rule for the structure, and changing the structure to remove the violation of the design rule. The method may further include generating a report of the violation and the change, generating a phantom object based on the change, and outputting the report and the phantom object.

This disclosure also describes a system to report a phantom object for a structure in a PG router. The system may include a memory configured to store operations, and one or more processors configured to perform the operations including generating the structure of a power and ground (PG) network based on a spec received as input, identifying a violation of a design rule for the structure, and changing the structure to remove the violation of the design rule. The operations may further include generating a report of the violation and the change, generating a phantom object based on the change, and outputting the report and the phantom object.

This disclosure also describes a non-transitory computer-readable device having instructions stored thereon that, when executed by at least one computing device, causes the at least one computing device to perform operations including generating the structure of a power and ground (PG) network based on a spec received as input. The operations may also include identifying a violation of a design rule for the structure, and changing the structure to remove the violation of the design rule. The operations may further include generating a report of the violation and the change, generating a phantom object based on the change, and outputting the report and the phantom object.

This Summary does not completely signify the claimed embodiments. This Summary (as well as the Abstract) neither signifies essential elements of, nor limits the scope of, the claimed embodiments enabled by the Specification and Figures.

DRAWINGS

The following Detailed Description, Figures, and Claims signify the uses and advantages of the claimed embodiments. All of the Figures are used only to provide knowledge and understanding and do not limit the scope of the claimed embodiments and their embodiments. Such Figures are not necessarily drawn to scale.

Similar components or features used in the Figures can have the same, or similar, reference signs in the form of labels (such as alphanumeric symbols, e.g., reference numerals), and can signify a similar or equivalent use. Further, various components of the same type can be distinguished by following the reference label by a dash and a second label that distinguishes among the similar components. If only the first reference label is used in the Specification, its use applies to any similar component having the same first reference label irrespective of the second reference label. A brief description of the Figures is below.

Figure 9A:
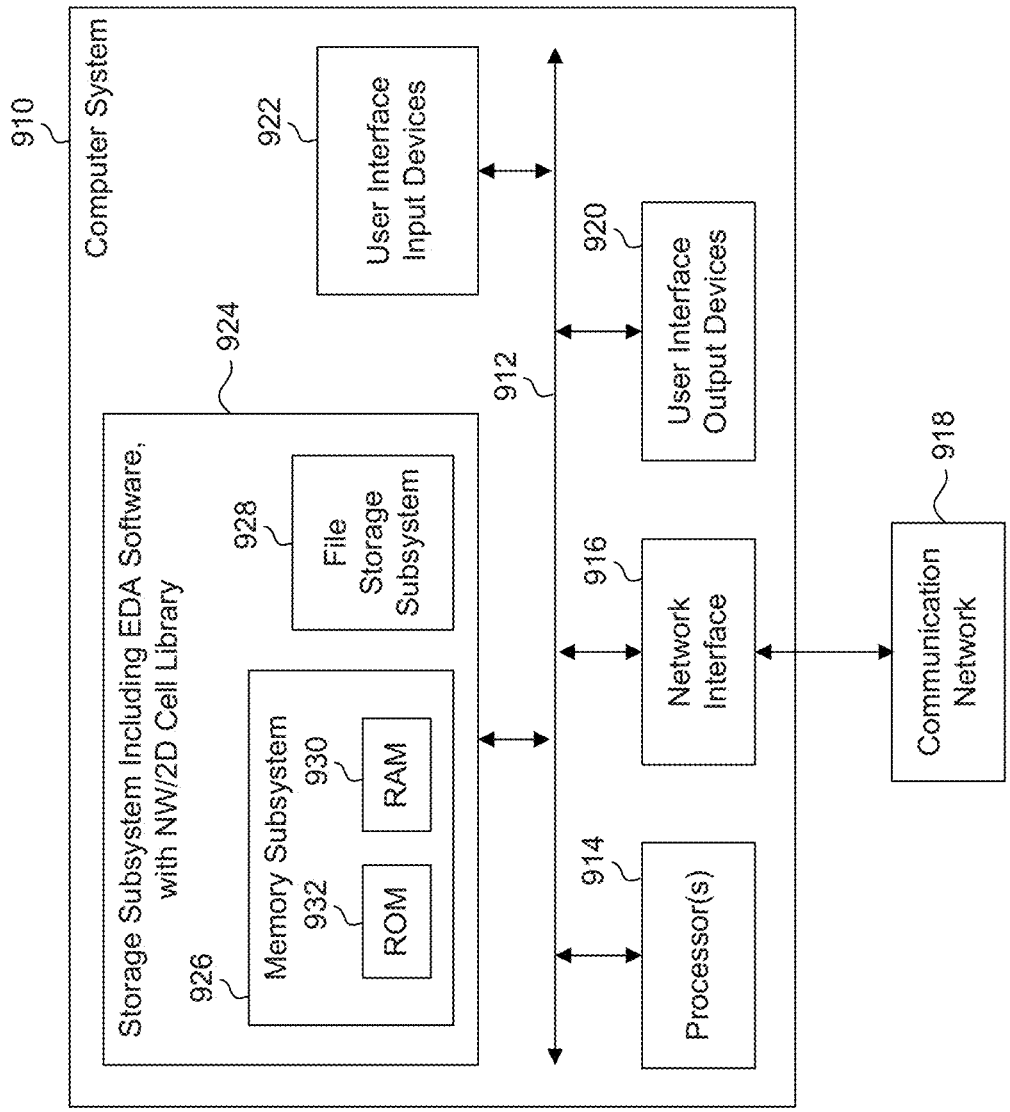
Figure 9C:
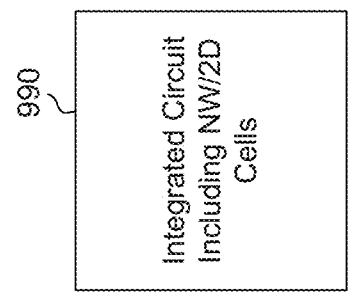
Figure 9B:
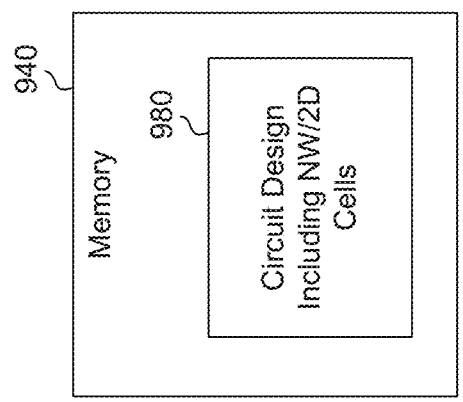

FIGS. 9A, 9B, and 9C illustrate abstract diagrams of a computer system for use in commerce, if needed, by the claimed embodiments, as well as an embodiment of a circuit design and an embodiment of a manufactured circuit used in these claimed embodiments.

Figure 10:
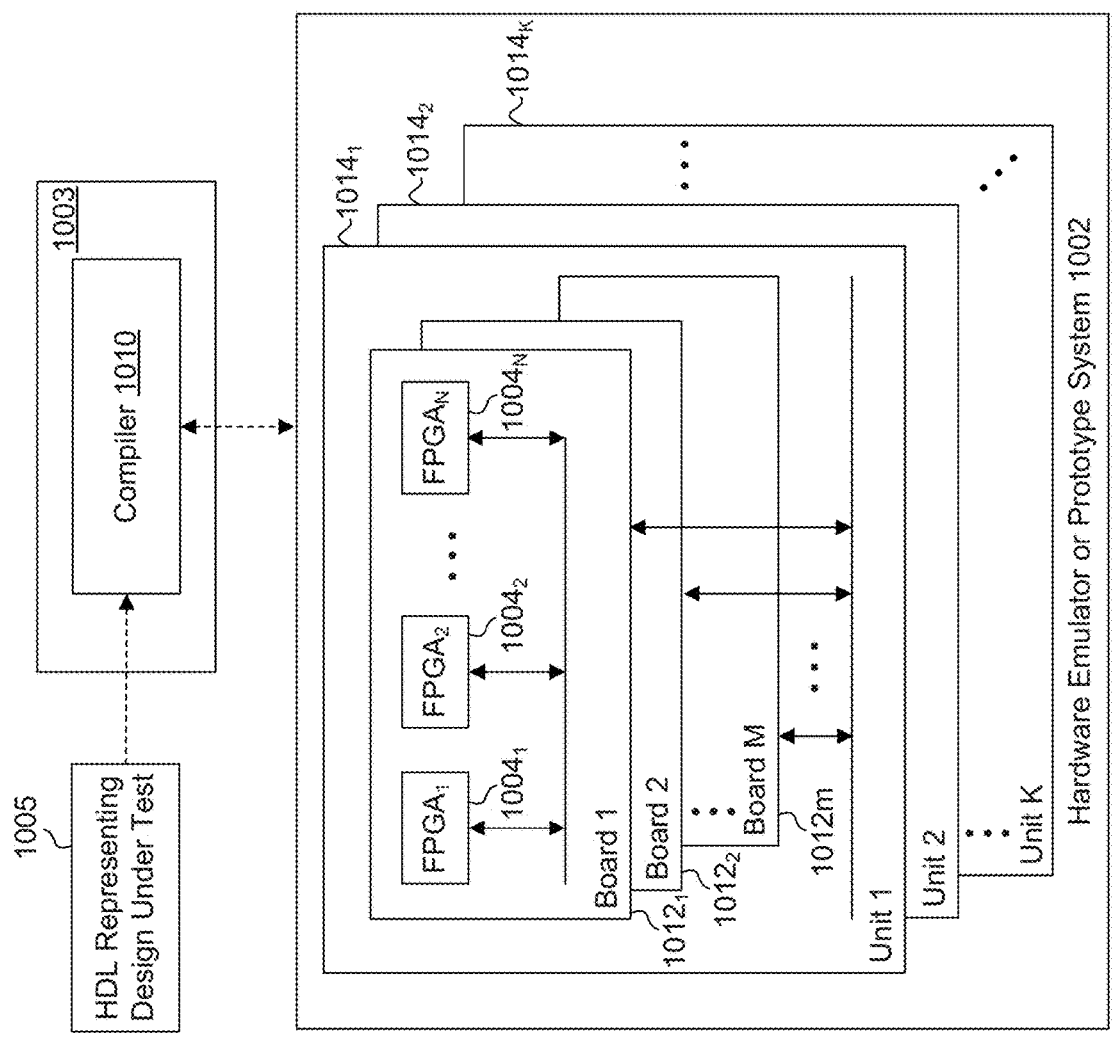

FIG. 10 illustrates a block diagram of an emulation system, according to some embodiments of the present disclosure.

In the figures, reference signs may be omitted as is consistent with accepted engineering practice; however, a skilled person will understand that the illustrated components are readily understood when viewed in context of the illustration as a whole and the accompanying disclosure describing such various figures.

DETAILED DESCRIPTION

The Figures and Detailed Description signify, only to provide knowledge and understanding, the claimed embodiments. To minimize the length of the Detailed Description, while various features, structures or characteristics can be described together in a single embodiment, they also can be used in other embodiments without being written about. Variations of any of these elements, and modules, processes, machines, systems, manufactures or compositions disclosed by such embodiments and/or examples are easily used in commerce. The Figures and Detailed Description also can signify, implicitly or explicitly, advantages and improvements of the claimed embodiments and their embodiments for use in commerce.

In the Figures and Detailed Description, numerous specific details may be described to enable one or more of the exemplary embodiments and/or examples. In the interest of not obscuring the presentation of the exemplary embodiments and/or examples in the following Detailed Description, some processing steps or operations that are known in the art may be combined together for presentation and for illustration purposes and might not be described in detail. However, a skilled person will recognize that these exemplary embodiments and/or examples may be used in commerce without these specific details or with equivalents thereof. In other instances, well-known processes and devices are not described in detail as not to unnecessarily obscure aspects of these exemplary embodiments and/or examples. In other instances, some processing steps or operations that are known in the art may not be described at all. Instead, the following description is focused on the distinctive features or elements of various exemplary embodiments and/or examples. Furthermore, while this description may refer to some components of the structure in the singular tense, more than one component may be depicted throughout the Figures and like components are labeled with like numerals.

An integrated circuit (IC) design and manufacturing process produces IC chips. IC design software tools, such as a PG router, can be used to create an IC design, such as a power and ground (PG) network. Once the IC design is finalized, it can undergo fabrication, packaging, and assembly to produce IC chips. The overall IC design and manufacturing process can involve multiple entities, e.g., one company may create the software for designing ICs, another company may use the software to create the IC design, and yet another company may manufacture IC chips based on the IC design. An IC design flow can include multiple steps, and each step can involve using one or more IC design software tools. An improvement to one or more of these steps in the IC design flow results in an improvement to the overall IC design and manufacturing process. Specifically, the improved IC design and manufacturing process can produce IC chips with a shorter time-to-market (TTM) and/or higher quality of results.

As an IC design progresses through an IC design flow, the IC design can be represented at different levels of abstraction by using different data formats or languages. In general, higher levels of abstraction contain fewer details of the IC design than lower levels of abstraction. Typically, the IC design is described at a high level of abstraction in the early stages of the IC design flow, and the level of abstraction becomes progressively lower as the IC design moves through the IC design flow (i.e., the description of the IC design becomes more specific as the IC design progresses through the IC design flow).

For example, toward the beginning of the IC design flow, an IC design can be described at a high level of abstraction by using a hardware description language (HDL) which describes the functionality of the IC design but does not include information about the actual geometric shapes that will be printed on the wafer. Toward the end of the IC design flow, the same IC design can be represented in a low level of abstraction by using a data format or language such as GDSII or OASIS, which contains a description of the actual geometric shapes that are to be printed on the wafer. In between these two ends of the IC design flow, the IC design may be represented in numerous data formats or languages that describe the same IC design at different levels of abstraction.

Some examples of IC design steps and the associated software tools are described below. These examples are for illustrative purposes only and are not intended to limit the embodiments to the forms disclosed. This disclosure describes techniques and systems that can be used in one or more IC design steps.

IC design software tools enable IC designers to describe the functionality that the IC designers want to implement. These tools also enable IC designers to perform what-if planning to refine functionality, check costs, etc. During logic design and functional verification, the HDL, e.g., System Verilog, code can be written and the design can be checked for functional accuracy, e.g., the design can be checked to ensure that it produces the correct outputs.

During synthesis and design for test, the HDL code can be translated to a netlist using one or more IC design software tools. Further, the netlist can be optimized for the target technology, and tests can be designed and implemented to check the finished chips. During netlist verification, the netlist can be checked for compliance with timing constraints and for correspondence (i.e., equivalence checking) with the RTL design and/or HDL code.

During design planning, an overall floorplan for the chip can be constructed and analyzed for timing and top-level routing. The overall floorplan can serve as a user-defined spec to create physical implementation of the design by one or more IC design software tools. During physical implementation, circuit structures can be positioned in a layout and can be electrically connected. Circuit structures can include wires, vias, and other structures to form a layout of an integrated circuit. The design software tools can check for design rule violations for each of the circuit structures. A design rule can be a rule to specify a placement of a circuit structure relative to surrounding circuit structures. Some IC design software tools can automatically correct the circuit structure having design rule violations and resolve the design rule violations (referred to as "correct-by-construction" IC design software tools).

During analysis and extraction, the IC design's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped out" to produce masks which are used during fabrication.

As mentioned above, the design of a PG network created by correct-by-construction IC design software tools, such as a PG router may have issues that can cause chip performance and reliability problems. A PG network can refer to power and ground connections for various circuit elements, such as transistors and capacitors, in a floorplan of an integrated circuit. A PG router can include an IC design software tool to generate, check, change, and fix a circuit structure, such as a wire and a via, in a layout of a PG network. IC Designers may find the PG network created by correct-by-construction PG routers does not meet IR-drop or EM requirements using PG analysis tools at later implementation or sign-off stages. Existing correct-by-construction PG routers may not report the difference between the created PG network and the target PG network in the floorplan, nor the reasons why some circuit structures, such as the wires and vias, are removed or changed during the creation of the PG network. Thus, even when IC designers find out the created PG network does not work as expected, they may find it difficult to debug and fix the issues without knowing the changes of the circuit structures and the reasons behind the changes.

Various embodiments in accordance with the present disclosure provide methods and systems for reporting a phantom object for a circuit structure in a PG router to assist IC designers in debugging and fixing issues during creation of the PG network. The PG router can generate the circuit structure of the PG network based on a spec provided by an IC designer. Then the PG router can check the generated circuit structure for design rule violations. If the generated circuit structure is Design Rule Check (DRC) clean, which means the generated circuit structure has no design rule violations, the generated circuit structure can be stored in a database and used to create a layout for the PG network.

If the generated circuit structure violates one or more design rules, the PG router can change the circuit structure to remove the violations of the one or more design rules, for example, removing a segment of a wire to fix an overlapping violation. The PG router can generate a phantom object based on the change and a report of the design rule violations and the change of the circuit structure. The PG router can output the phantom object and report on the layout to assist IC designers in debugging and fixing issues of the PG network.

After the generated circuit structure is changed, the PG router can re-check the changed circuit structure for design rule violations. If the changed circuit structure is DRC clean, the changed circuit structure can be stored in the database and used to create the layout for the PG network. If the changed circuit structure violates additional design rules, the PG router can continue to update the changed circuit structure to resolve the violations of the additional design rules. The checking and changing steps can repeat until the changed circuit structure is DRC clean, or a predetermined number of iterations is reached.

The phantom objects and the reports can help designers to understand where and why part of PG network is not generated as expected in the spec. The phantom objects and the reports can be embedded in each PG network creation command, and the phantom objects and the reports can be displayed in a layout window and an error message window of a graphical user interface (GUI) respectively to the designer (referred to as "phantom object reporting system"). The phantom object reporting system can help the designer to debug and fix issues of the PG network. The designer may identify failures in certain regions, update the spec for these regions, and re-generate the PG network with updated spec. The designer may also trace and analyze each missing wire segment and via, and manually address them if necessary.

Figure 1:
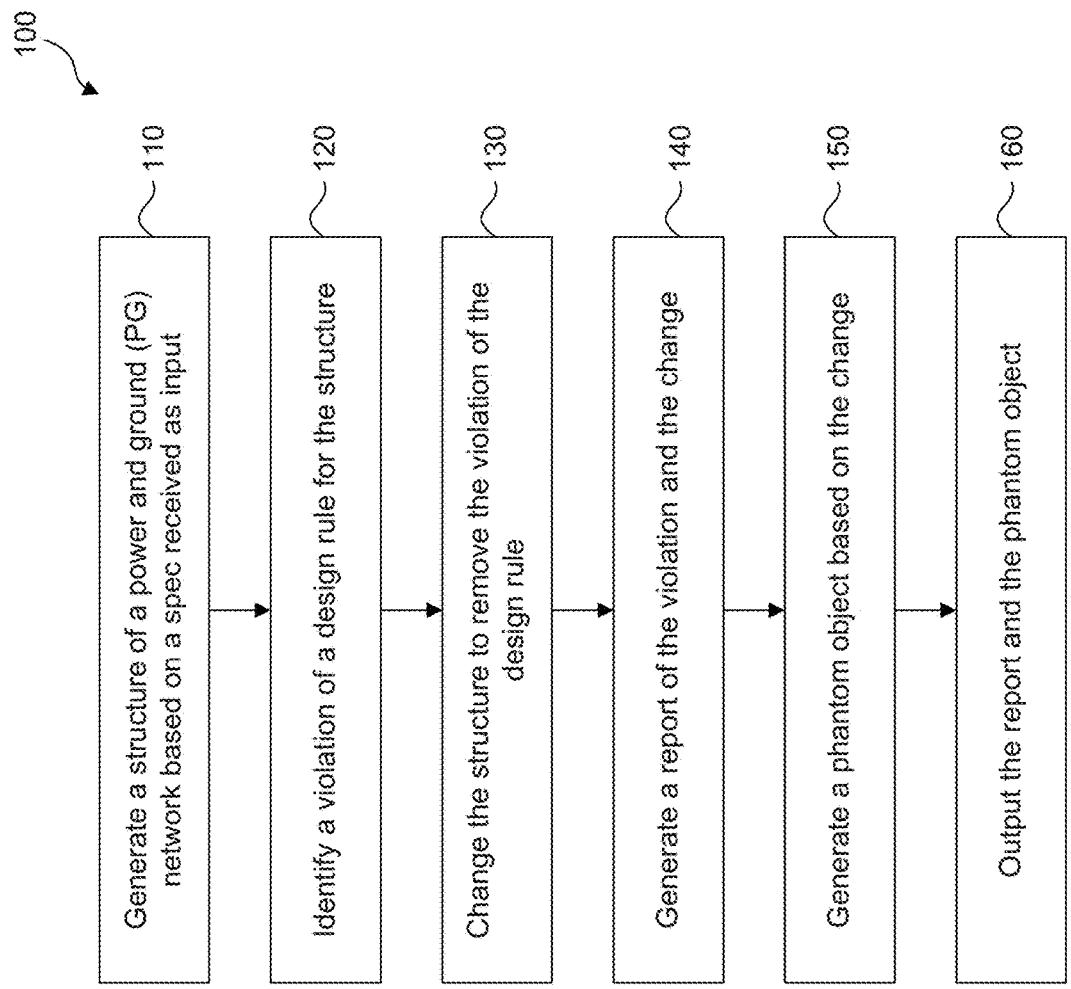
FIG. 1 illustrates a flow-chart of a method to report a phantom object for a structure in a PG router, according to some embodiments of the present disclosure.

FIG. 1 illustrates a flow-chart of method 100 to report a phantom object for a structure in a PG router, according to some embodiments of the present disclosure. Additional operations may be performed between various operations of method 100 and may be omitted merely for clarity and ease of description. Additionally, some of the operations may be performed simultaneously, or in a different order than the ones shown in FIG. 1. Accordingly, it is understood that additional processes can be provided before, during, and/or after method 100, and that these additional processes can be briefly described herein. For illustrative purposes, the operations illustrated in FIG. 1 will be described with reference to the example processes and layouts to report a phantom object as illustrated in FIGS. 2-7.

Figures 2A, 2B:
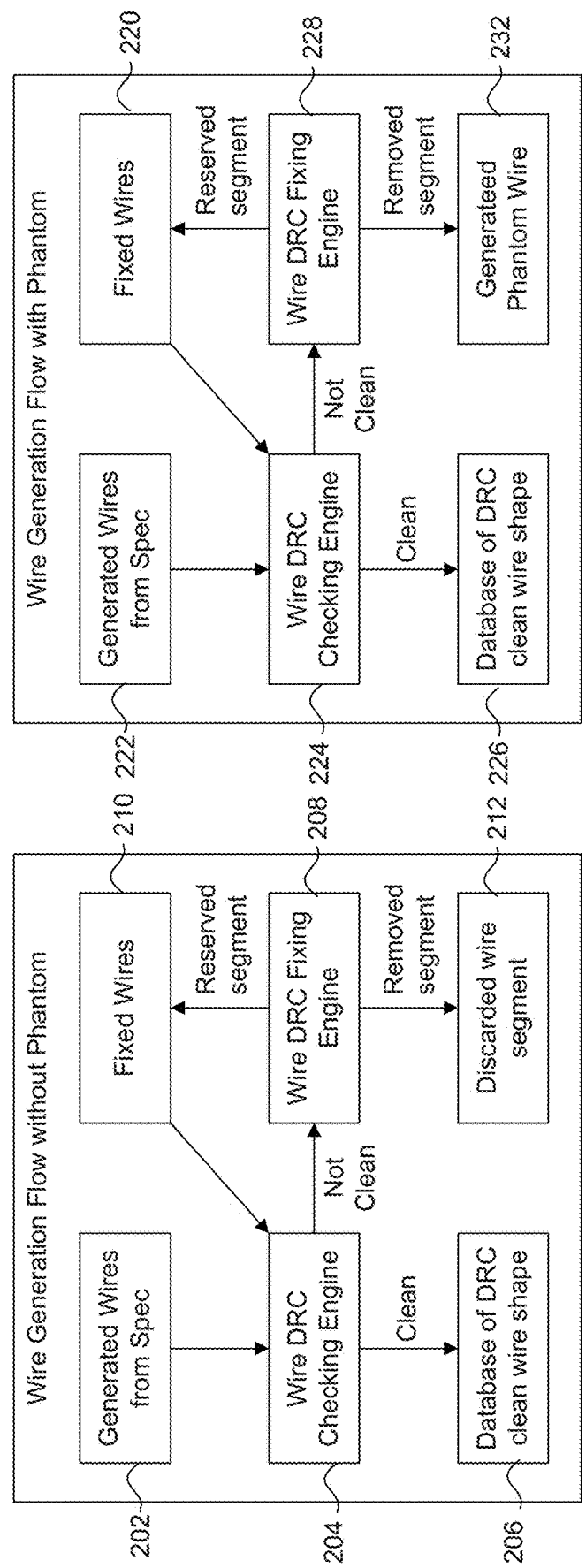
FIG. 2A illustrates a PG wire creation flow without phantom wire reporting in a PG router, according to some embodiments of the present disclosure.
FIG. 2B illustrates a PG wire creation flow with phantom wire reporting in a PG router, according to some embodiments of the present disclosure.
Figure 4:
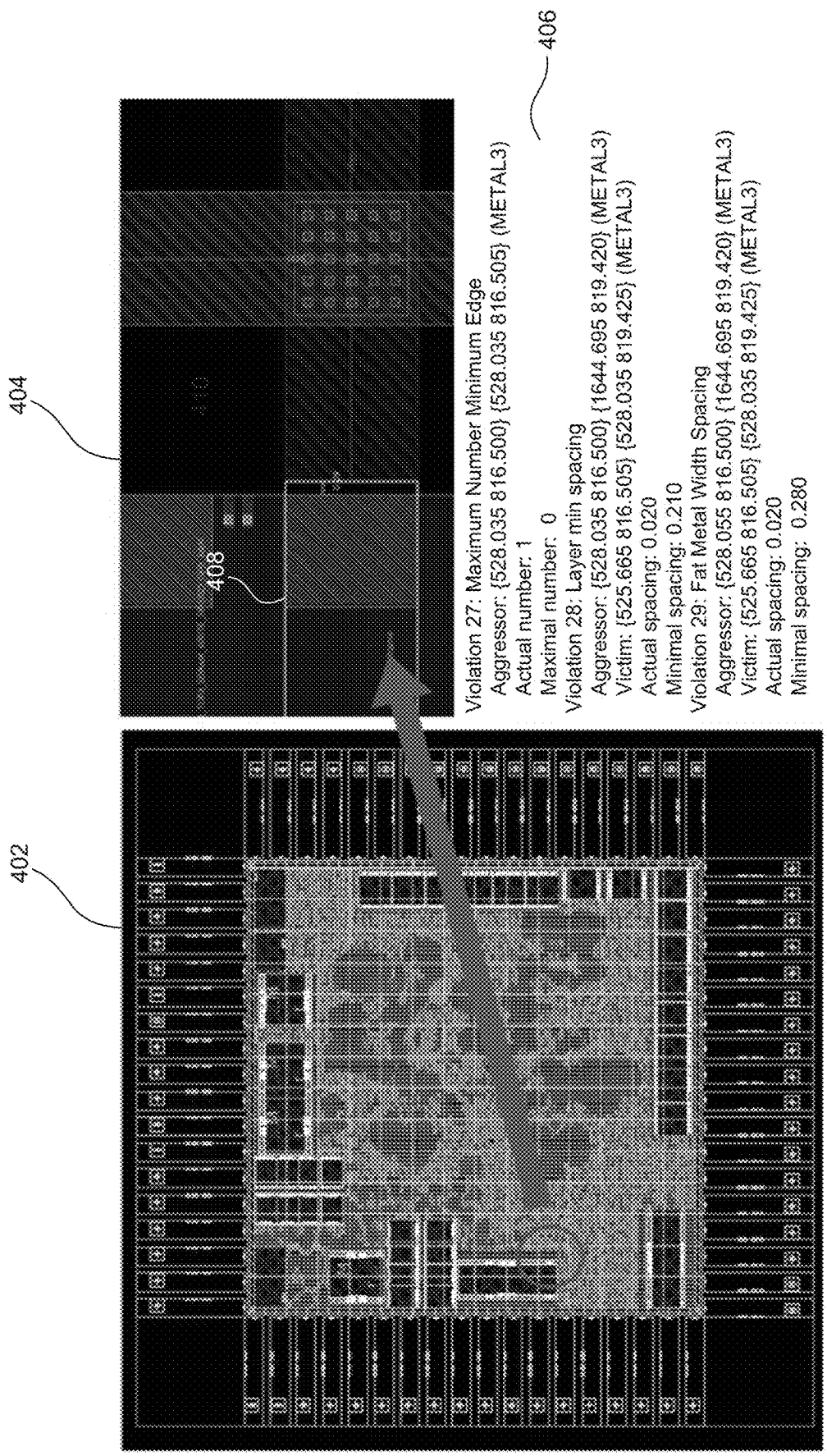
FIG. 4 illustrates an example of phantom wire report, according to some embodiments of the present disclosure.
Figures 5A, 5B:
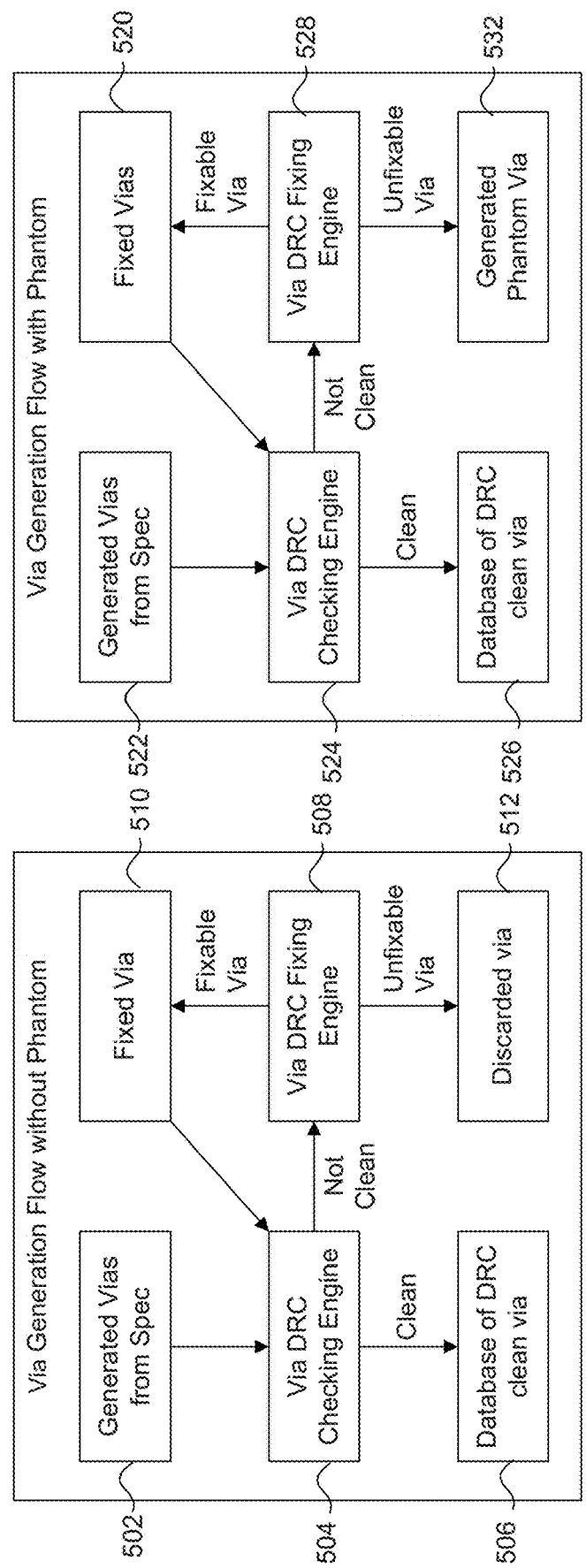
FIG. 5A illustrates a PG via creation flow without phantom via reporting in a PG router, according to some embodiments of the present disclosure.
FIG. 5B illustrates a PG via creation flow with phantom via reporting in a PG router, according to some embodiments of the present disclosure.
Figure 7:
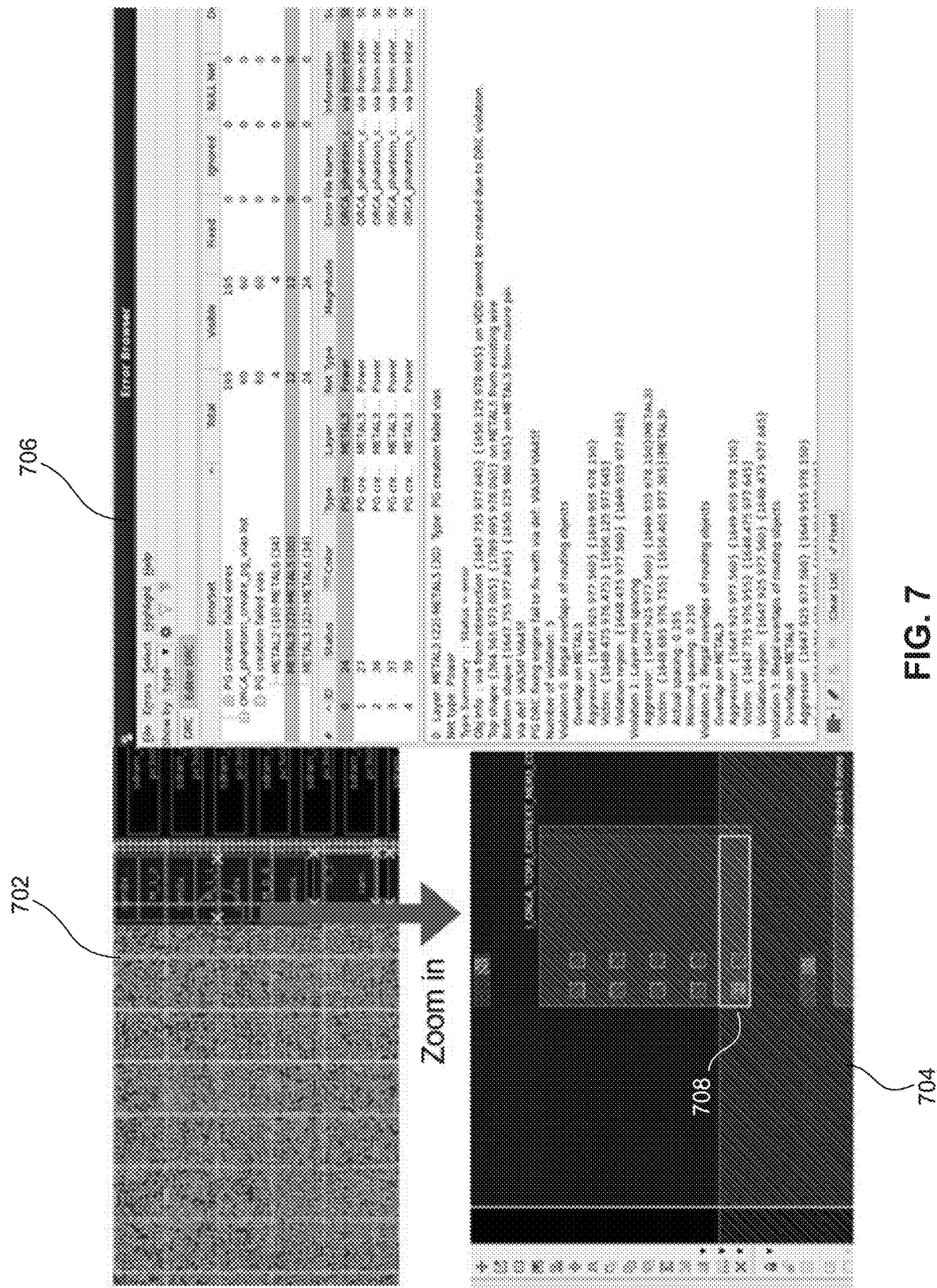
FIG. 7 illustrates an example phantom via report, according to some embodiments of the present disclosure.

Referring to FIG. 1, in operation 110, a structure of a power and ground (PG) network is generated based on a spec received as input. In some embodiments, the structure can include wires, vias, and other structures to form a layout of a circuit. In some embodiments, a spec can specify a placement of a structure, such as a wire or a via, in a layout relative to surrounding circuit structures. In some embodiments, the structure of the PG network can be placed in the layout based on the spec, which is referred to as "generating the structure." For example, as shown in FIGS. 2A and 2B, generated wires 202 and 222 can be generated from a spec provided by a designer. In another example, as shown in FIGS. 5A and 5B, generated vias 502 and 522 can be generated from another spec provided by the designer. In some embodiments, the generated wires and vias can be a physical implementation of a floorplan based on user-defined specs. As shown in FIGS. 4 and 7, a layout of the PG network can include zoomed-out and zoomed-in windows of generated wires and generated vias, according to some embodiments.

Referring to FIG. 1, in operation 120, a violation of a design rule is identified for the structure. According to some embodiments, a design rule can be a rule to specify a placement of a circuit structure relative to surrounding circuit structures. If the generated structure violates a design rule, also referred to as "not DRC clean', it cannot be physically implemented in the layout. The generated structure may be removed or fixed to satisfy the design rule. For example, as shown in FIGS. 2A and 2B, the generated wires can be checked by wire DRC checking engines 204 and 224 for violations of wire design rules. If the generated wires do not violate any design rule, also referred to as "DRC clean", the generated wires can be stored in databases 206 and 226 of DRC clean wire shape for creation of the layout. If the generated wires violate one or more design rules, wire DRC fixing engines 208 and 228 may fix the generated wires. In another example, as shown in FIGS. 5A and 5B, the generated vias can be checked by via DRC checking engines 504 and 524 for violations of via design rules. If the generated vias are DRC clean, the generated vias can be stored in databases 506 and 526 of DRC clean via for creation of the layout. If the generated vias violate one or more design rules, via DRC fixing engines 208 and 228 may fix the generated vias.

Referring to FIG. 1, in operation 130, the structure is changed to remove the violation of the design rule. For example, as shown in FIGS. 2A and 2B, wire DRC fixing engines 208 and 228 may change the generated wires by removing segments of the wires to resolve the violation (also referred to as "fixing the generated wires"). The reserved segment of the wires can create fixed wires 210 and 220. In FIG. 2A, the removed segment of the wires can be discarded as discarded wire segment 212, according to some embodiments. In FIG. 2B, phantom wire 232 can be generated based on the removed segment of the wires, according to some embodiments. Phantom wire information and DRC violation report of the removed segments can be generated to help the designer find out where and why the segment of wires is removed and fix the generated wires.

In another example, as shown in FIGS. 5A and 5B, via DRC fixing engines 508 and 528 may determine whether the vias are fixable based on the spec and the violated design rule. If the via can be changed, for example adding metal patch or new contact code, to resolve the design rule violation, the via can be identified as fixable. And if the via cannot be changed to resolve the design rule violation, the via can be identified as unfixable. If the vias are fixable, via DRC fixing engines 508 and 508 can change the vias to resolve the design rule violation (also referred to as "fixing the vias") and create fixed vias 510 and 520. If the vias are not fixable, the unfixable vias can be removed as discarded vias 512 shown in FIG. 5A, according to some embodiments. Phantom via 532 can be generated based on the unfixable via as shown in FIG. 5B, according to some embodiments. Phantom via information and DRC violation report of the unfixable via can be generated to help the designer find out where and why the unfixable via is removed and fix the generated vias.

Figure 3:
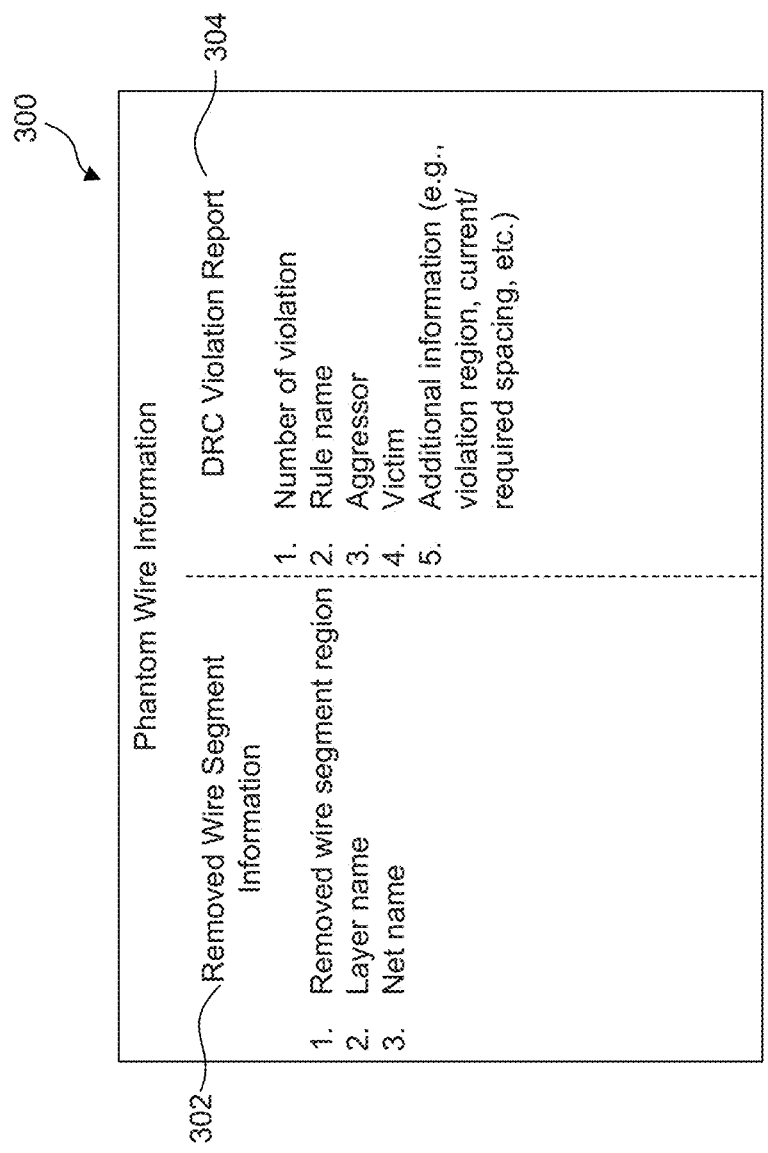
FIG. 3 illustrates an example list of phantom wire information, according to some embodiments of the present disclosure.
Figure 6:
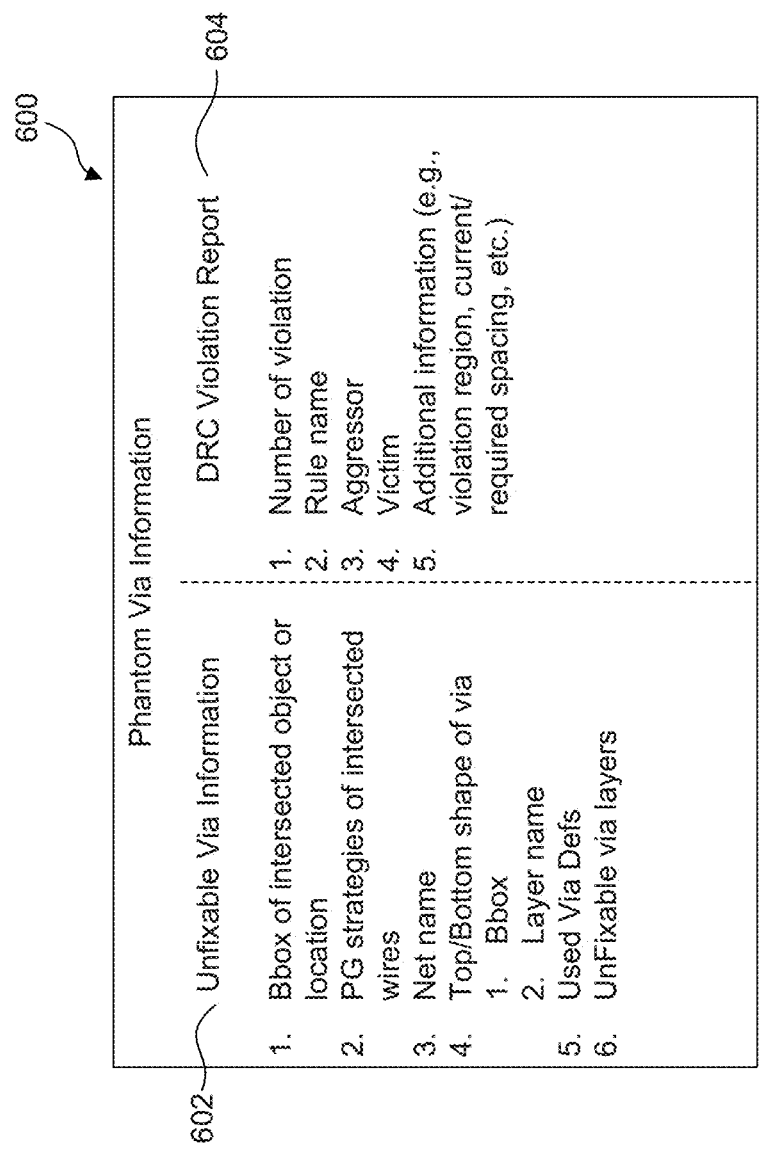
FIG. 6 illustrates an example list of phantom via information, according to some embodiments of the present disclosure.

Referring to FIG. 1, in operation 140, a report of the violation and the change is generated. For example, as shown in FIG. 3, a report of phantom wire information 300 can be generated to include removed wire segment information 302 and DRC violation report 304 of the removed wire segment. In another example, as shown in FIG. 6, a report of phantom via information 600 can be generated to include unfixable via information 602 and DRC violation report 604 of the unfixable via.

Referring to FIG. 1, in operation 150, a phantom object is generated based on the change. In some embodiments, a phantom object can be an object discarded from a circuit structure in a layout and highlighted in the layout for assisting designers to debug and fixing issues, not a circuit structure having connections to the PG network and performing functions in the PG network. For example, as shown in FIG. 2B, phantom wire 232 can be generated based on the removed segment of the wires, according to some embodiments. In another example, as shown in FIG. 5B, phantom via 532 can be generated based on the unfixable via, according to some embodiments. In some embodiments, the phantom object can be generated overlaying on the structure in the layout of the PG network.

Referring to FIG. 1, in operation 160, the report and the phantom object are outputted. For example, as shown in FIG. 4, a phantom wire and a DRC violation report can be outputted on a graphical user interface (GUI) to help the designer to debug where and why the segment of wires is removed and to fix the generated wires. In zoomed-out window 402, a layout of a chip can include DRC clean circuit structures and phantom wires. Zoon-in window 404 of a phantom wire can show clearly a phantom wire overlaying on a wire. And error browser 406 can provide DRC violation reports of the phantom wire to the designers.

In another example, as shown in FIG. 7, a phantom via and a DRC violation report can be outputted on the GUI to help the designer to debug where and why the unfixable via is removed and to fix the generated vias. In zoomed-out window 702, a layout of a chip can include DRC clean circuit structures and phantom vias. Zoon-in window 704 of a phantom via can show clearly two phantom vias highlight by a box. Error message window 706 can provide DRC violation reports of the phantom via to the designers.

FIG. 2A illustrates a PG wire creation flow without Phantom in a PG router, according to some embodiments of the present disclosure, The PG router can first create generated wires 202 based on a spec provided by a designer. Then generated wires 202 can be checked by wire DRC checking engine 204 to identify if they violate any design rules. Wires that are DRC clean can be stored in a database 206 of DRC clean wire shape. For generated wires with one or more design rule violations, the PG router can modify generated wires 202 to fix the violations and create fixed wires 210. As shown in FIG. 2A, fixed wires 210 can be fed back to wire DRC checking engine 204 to check again. If fixed wires 210 do not violate any design rule, also referred to as "DRC clean", fixed wires 210 can be stored in database 206 of DRC clean wire shape. If fixed wires 210 violate additional design rules, the fixing and checking processes can repeat for a predetermined number of iterations, for example, 1000 iterations. Wires that cannot be fixed within the predetermined number of iterations can be discarded.

FIG. 2B illustrates a PG wire creation flow with phantom wire reporting in a PG router according to some embodiments of the present disclosure. In some embodiments, the PG wire creation flow shown in FIG. 2B can be similar as in FIG. 2A with an additional process of Phantom wire generation. In some embodiments, phantom wire reporting can provide the designer debugging information of the removed wire segments. When one of generated wires 222 is identified not DRC clean by wire DRC checking engine 224, wire DRC fixing engine 228 can fix it by removing a wire segment to resolve the violation. In some embodiments, the phantom wire reporting system in the PG router can generate a phantom wire 232 based on the removed wire segment and a report of phantom wire information 300 as shown in FIG. 3.

FIG. 3 illustrates an example list of phantom wire information 300, according to some embodiments of the present disclosure. In some embodiments, phantom wire information 300 can include removed wire segment information 302 and DRC violation report 304, In some embodiments, DRC violation report 304 can include design rule violations identified by wire DRC checking engine 224 and wire segment information 302 can include how the wire is modified by wire DRC fixing engine 228 to resolve the violations. In some embodiments, removed wire segment information 302 can include removed wire segment region, layer name, net name, and other related wire segment information. In some embodiments, the DRC violation report 304 can include a number of the violations, rule names, aggressors, victims, and additional information such as violation region, current spacing, and required spacing.

For example, if a wire is cut short to fix an overlapping violation, the removed wire segment can generate a phantom wire associated with the overlapping DRC violation. The remaining wire segment can continue the checking and fixing processes for a predetermined number of iterations. In some embodiments, if a wire is modified a number of times, the phantom wire reporting system can create multiple phantom wires during each iteration. After the predetermined number of iterations, if the phantom wires generated during each iteration are overlapping with the generated wire, the phantom wire reporting system can merge the phantom wires to reduce the number of reported phantom wires.

FIG. 4 illustrates an example of phantom wire report, according to some embodiments of the present disclosure. In some embodiments, the phantom wire information can be saved as an error browser item (e.g., error messages in a user interface). As shown in FIG. 4, zoomed-out window 402 illustrates a layout of a chip including generated DRC clean wires and phantom wires. Zoon-in window 404 illustrates a phantom wire 408 highlighted with a box overlaying on a wire 410. Error message window 406 can provide DRC violation reports related to the phantom wire. In some embodiments, the phantom wires can have multiple pieces due to overlapping with different circuit structures. Each phantom wire that corresponds to removed wire segments can be highlighted in the GUI with detailed phantom wire information listed in error message window 406. An aggressor can be a circuit structure that leads to a violation of a design rule. A victim can be a circuit structure that is affected by the violation of the design rule. For example, as shown in FIG. 4, violation 28 in error message window 406 can be a violation of "Layer min spacing" rule. The aggressor of violation 28 can be in METAL3 layer and specified by X-Y coordinates between {528.035 816.500} and {528.035 816.505} in the generated PG network layout. Similarly, the victim of violation 28 can be in METAL3 layer and specified by X-Y coordinates between {525.665 816.505} and {528.035 819.425}. The actual spacing between the wire and another circuit structure can be 0.020, which can violate the design rule for a minimal spacing of 0.210.

FIG. 5A illustrates a PG via creation flow without phantom via reporting in a PG router, according to some embodiments of the present disclosure. The PG router can first creates generated vias 502 based on a spec provided by a designer. Generated vias 502 can then be checked by via DRC checking engine 504 to identify if there is any DRC violation. If a via is identified as DRC clean, the via can be stored in a database 506 of DRC clean via. If a via is identified as DRC not clean, the via can be processed by via DRC fixing engine 528 to resolve the violations. Via DRC fixing engine 528 may predict if a via is fixable or not. If a via is predicted fixable, the PG router can modify and check the via for a predetermined number of iterations until the via is DRC clean or the iteration count reaches the predetermined number. The PG router can discard and remove from the PG network the vias that are predicted unfixable and the vias that still have design rule violations after the predetermined number of iterations.

FIG. 5B illustrates a PG via creation flow with phantom via reporting in a PG router, according to some embodiments of the present disclosure. In some embodiments, the PG via creation flow shown in FIG. 5B can be similar as in FIG. 5A with an additional process of Phantom via generation. When one of generated vias 522 is identified not DRC clean by via DRC checking Engine 524, via DRC fixing engine 528 can predict if it is fixable based on the spec and the violated design rule. The PG router can remove any vias that have been predicted unfixable and any vias that still have design rule violations after the predetermined number of iterations. In some embodiments, the phantom via reporting system in the PG router can generate a phantom via 532 based on the discarded via and a report of phantom via information 600 as shown in FIG. 6.

According to some embodiment, the designer may need to know both whether a wire is created and how the wire is created to debug the fix wire issues, while the designer may debug and fix via issues based on whether a via is created. In some embodiments, phantom via reporting system in the PG router may generate phantom vias and reports for unfixable vias, and may not generate phantom vias and reports for vias that can be fixed with modifications (e.g., adding metal patch or new contact code). Additionally, a DRC violation report of an unfixable via can be generated based on the DRC violation information in the first iteration. For example, if a via is predicted fixable but finally discarded after reaching the predetermined number of iterations, the DRC violation report can be created with the DRC violation information of the first iteration.

FIG. 6 illustrates an example list of phantom via information 600, according to some embodiments of the present disclosure. In some embodiments, phantom via information 600 can include unfixable via information 602 and DRC violation report 604. In some embodiments, the unfixable via information 602 can include bonding box (BBox) of intersected object or location, PG strategies of intersected wires, net name, top and bottom shapes of via, used via definitions, unfixable via layers, and other related information of the unfixable via. In some embodiments, the DRC violation report 604 can include a number of violations, rule names, aggressors, victims, and additional information such as violation region, current spacing, and required spacing.

FIG. 7 illustrates an example of phantom via report, according to some embodiments of the present disclosure. In some embodiments, the phantom via report in a GUI can be similar as the phantom wire report as shown in FIG. 4. A phantom via 708 can be marked with a cross in a zoomed-out window 702, and can be highlighted with a box in zoomed-in window 704, as shown in FIG. 7. Error message window 706 can display phantom via information shown in FIG. 6. For example, error message window 706 can include a layer and a net of the phantom via. Additionally, error message window 706 can filter phantom vias by a certain region or a specific structure. For example, as shown in FIG. 7, error message window 706 can display violation information details for PG created failed vias in layer METAL3-METAL5.

With phantom object reporting system in a PG router, a designer can debug and fix issues of PG network created by the PG router knowing where a circuit structure is changed and how the circuit structure is changed. In some embodiments, the phantom object reporting system can be embedded in each PG network creation command in the PG router. For example, thousands of wires can be generated for connection of a macro. Some of generated wires may not be aligned to a pin and this can violate a minimum edge design rule. A DRC fixing engine can fix the design rule violation by detaching these generated wires from the pin. This can cause some of the wires in the macro not connected. Without phantom object reporting system, the design may need a separate connectivity check to identify these detached wires. Additionally, the designer may not know the reason for the detached wires and not be able to debug and fix the detached wires. With phantom object reporting system, the PG router can generate phantom wires for the detached wire and display the phantom wires and corresponding phantom wire information in the GUI of the PG router, which can be shown in FIG. 4 and can provide the designer where the generated wires are detached and why they are detached. Furthermore, the phantom wires can be highlighted in a box in FIG. 4 for the designer. The designer can find out that the disconnection can be a result of the violation of minimum edge design rule. Accordingly, the designer can update the spec and re-generate the wires, for example, adjusting an offset or a pitch to avoid the issues.

Detailed Description—Technology Support EDA System/Workflow Explanation

Figure 8:
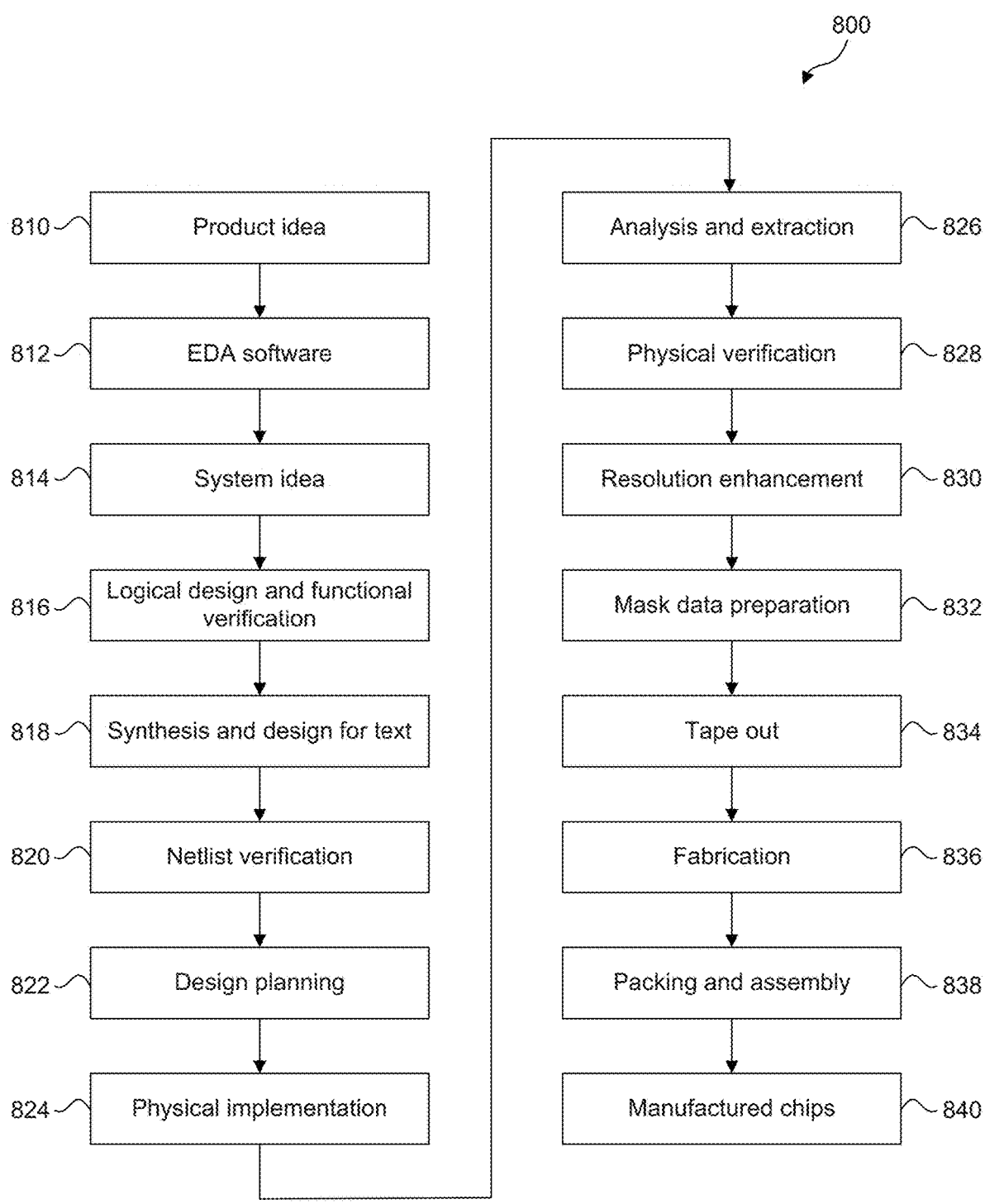
FIG. 8 illustrates a flowchart of various operations in the design and fabrication of an integrated circuit, according to some embodiments of the present disclosure.

FIG. 8 illustrates various processes 810-840 performed in the design, verification and fabrication of an item of manufacture such as an integrated circuit using software tools with a computer, and possibly special hardware-assisted tools, to transform and verify design data and instructions that represent the integrated circuit. The term 'EDA' signifies the term 'Electronic Design Automation'. These processes start with the creation of a product idea 810 with information supplied by a designer, information which is transformed during a process to create an item of manufacture (referred to herein as a design or device) that uses an EDA software tool 812, which may also be signified herein as EDA software, as a design tool, or a verification tool. When the design is finalized, it can be taped-out 834, which typically is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed, which result in the finished integrated circuit 840 which may also be signified herein as a circuit, device, component, chip or SoC (System on Chip).

A spec, or specifications, for a circuit structure or electronic structure may be used in commerce at multiple levels of useful abstraction ranging from low-level transistor material layouts to high-level description languages. Most designers start with a description using one or more modules with less detail at a high-level of abstraction to design their circuits and systems, using a hardware description language ("HDL") such as VHDL, Verilog, SystemVerilog, SystemC, MyHDL or OpenVera. The high-level description is easier for designers to understand, especially for a vast system, and can describe very complex systems that are difficult to understand using a lower level of abstraction that is a more detailed description. Thus, a circuit structure may be represented by descriptions as code, for example, which may later be translated into physical circuit components.

The HDL description can be transformed into other levels of abstraction that are used by the developers. For example, a high-level description can be transformed to a logic-level register transfer level ("RTL") description, a gate-level description, a layout-level description, or a mask-level description. Each lower abstraction level that is a less abstract description adds more useful detail into the design description, for example, more details for the modules that comprise the description. The lower-levels of abstraction that are less abstract descriptions can be generated by a computer, derived from a design library, or created by another design automation process.

An example of a specification language at a lower level of abstraction language for specifying more detailed descriptions is SPICE, which is much used for detailed descriptions of circuits with many analog components. A circuit specification for a circuit also has value as an article of manufacture in commerce as a good under the Uniform Commercial Code. See U.C.C. art. 2, pt. 1. Descriptions at each level of abstraction are enabled for use by the corresponding tools of that layer (for example, a formal verification tool), and some of the modules of the abstractions need not be novel or unobvious.

A design process that uses an EDA software 812 tool includes processes 814 to 832, which are described below. This design flow description is for illustration purposes only and is not meant to limit the present disclosure. For example, an actual integrated circuit design may require a designer to perform the design operations in a different sequence than the sequence described herein.

During system design 814, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and DesignWare products.

During logic design and functional verification 816, modules in the circuit are specified in one or more hardware description languages, or HDLs, and the design in HDL is checked for functional accuracy, that is, to match the requirements of the specification of the circuit or system being designed to ensure that the design produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as "emulators" or "prototyping systems" are used to speed up the functional verification. Exemplary EDA software products from Synopsys, Inc. of Mountain View, Calif. that can be used at this stage include: VCS, Vera, DesignWare, Magellan, Formality, ESP and Leda products. Exemplary emulator and prototyping products also available from Synopsys that can be used at this state include: ZeBu® and Protolink® (® signifies 'Registered Trademark').

During synthesis and design for test 818, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, TetraMAX, and DesignWare products.

During netlist verification 820, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 822, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 824, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 826, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 828, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 830, geometric manipulations of the layout are performed to improve manufacturability of the design. Exemplary EDA software products from Synopsys, Inc. of Mountain View, Calif. that can be used at this stage include: Proteus products.

During tape-out 834, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 832, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 812.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

Detailed Description—Technology Support General Computer Explanation

FIGS. 9A, 9B and 9C are simplified block diagrams of a computer system suitable for use with embodiments of the technology, as well as circuit design and circuit embodiments of the technology.

In FIG. 9A, computer system 910 typically includes at least one computer or processor 914 which communicates with a number of peripheral devices via bus subsystem 912. Typically, the computer can include, or the processor can be, any of a microprocessor, graphics processing unit, or digital signal processor, and their electronic processing equivalents, such as an Application Specific Integrated Circuit ('ASIC') or Field Programmable Gate Array ('FPGA'). The terms 'processor' and 'computer' are further defined below. These peripheral devices may include a storage subsystem 924, comprising a memory subsystem 926 and a file storage subsystem 928, user interface input devices 922, user interface output devices 920, and a network interface subsystem 916. The input and output devices allow user interaction with computer system 910.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine capable of executing instructions (sequential or otherwise) that specify actions to be taken by that machine.

The computer system typically includes an operating system, such as Microsoft's Windows, Sun Microsystems's Solaris, Apple Computer's macOS, Linux, or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Examples of the claimed embodiments are neither limited to conventional computer applications nor the programmable apparatus that run them. For example, the embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions to perform any one or more of the sets of instructions discussed herein. Due to the ever-changing nature of computers and networks, the description of computer system 910 depicted in FIG. 9A is intended only as one example for purposes of illustrating the preferred embodiments. Many other configurations of computer system 910 are possible having more or less components than the computer system depicted in FIG. 9A.

Network interface subsystem 916 provides an interface to outside networks, including an interface to communication network 918, and is coupled via communication network 918 to corresponding interface devices in other computer systems or machines. Communication network 918 may comprise many interconnected computer systems, machines and communication links. These communication links may be wireline links, optical links, wireless links, or any other devices for communication of information. Communication network 918 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 922 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term 'input device' is intended to include all possible types of devices and ways to input information into computer system 910 or onto communication network 918. User interface input devices typically allow a user to select objects, icons, text and the like that appear on some types of user interface output devices, for example, a display subsystem.

User interface output devices 920 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term 'output device' is intended to include all possible types of devices and ways to output information from computer system 910 to the user or to another machine or computer system.

Memory subsystem 926 typically includes a number of memories including a main random-access memory ('RAM') 930 (or other volatile storage device) for storage of instructions and data during program execution and a read only memory ('ROM') 932 in which fixed instructions are stored. File storage subsystem 928 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 928.

Bus subsystem 912 provides a device for letting the various components and subsystems of computer system 910 communicate with each other as intended. Although bus subsystem 912 is shown schematically as a single bus, alternative embodiments of the bus subsystem may use multiple busses. For example, RAM-based main memory can communicate directly with file storage systems using Direct Memory Access ('DMA') systems.

FIG. 9B depicts a memory 940 such as a non-transitory, computer readable data and information storage medium associated with file storage subsystem 928, and/or with network interface subsystem 916, and can include a data structure specifying a circuit design. The memory 940 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 9C signifies an integrated circuit 990 created with the described technology that includes one or more cells selected, for example, from a cell library.

Detailed Description—Technology Support
Hardware/Software Equivalence

Some of the embodiments and/or examples described herein comprise and/or use a processor. As used herein, the term 'processor' signifies a tangible data and information processing device that physically transforms data and information, typically using a sequence transformations (also referred to as "operations"). Data and information can be physically represented by an electrical, magnetic, optical or acoustical signal that is capable of being stored, accessed, transferred, combined, compared, or otherwise manipulated by the processor. The term 'processor' can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. No scientific evidence exists that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilinx or Intel's Altera), Random Access Memories (RAMs) or microprocessors. A module is configured to process data and information, typically using a sequence of transformations (also referred to as "operations") applied to the data and information (or in the case of ROMs and RAMS, transforming data and information by using the input information as an address for memory that stores output data and information), to perform aspects of the present embodiments and/or examples.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The 'substance' of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the embodiments and examples described in this specification. Such devices configurable by software include one or more computers, for example, standalone, client or server computers, or one or more hardware modules, or systems of one or more such computers or modules. As used herein, the term 'software application' signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the C programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software or has an interface device that receives the software over a network. This process is discussed in the General Computer Explanation section.

Detailed Description—Technology Support
Emulation Environment Explanation

An EDA software system, such as element 812 depicted in FIG. 8, typically includes an emulation system to verify the functionality of the circuit design. FIG. 10 depicts a typical emulation system which includes a host computer system 1003 (often part of an EDA system) and an emulator system 1002 (typically a set of programmable devices such as Field Programmable Gate Arrays (FPGAs)). The host system generates data and information, typically using a compiler 1010, to configure the emulator to emulate a circuit design. One of more circuit designs to be emulated are referred to as a Design Under Test ("DUT"). The emulator is a hardware system that emulates a DUT, for example, to use the emulation results for verifying the functionality of the DUT. One example of an emulation system that can be used for the embodiments disclosed herein is the ZeBu Server available from Synopsys, Inc.

The host system 1003 comprises one or more processors. In the embodiment where the host system is comprised of multiple processors, the functions described herein as being performed by the host system may be distributed among the multiple processors.

The host system 1003 typically includes a compiler 1010 that processes code written in a hardware description language that represents a DUT, producing data (typically binary) and information that is used to configure the emulation system 1002 to emulate the DUT. The compiler 1010 may transform, change, reconfigure, add new functions to, and/or control the timing of the DUT.

The host system and emulator exchange data and information using signals carried by an emulation connection. The connection can be one or more electrical cables, for example, cables with pin configurations compatible with the RS232 or USB protocols. The connection can be a wired communication medium or network, such as a local area network, or a wide area network such as the Internet. The connection can be a wireless communication medium or a network with one or more points of access, using a wireless protocol such as Bluetooth® or IEEE 802.11. The host system and emulator can exchange data and information through a third device, such as a network server.

The emulator includes multiple FPGAs (or other programmable devices), for example, elements $1004_1$ to $1004_N$ in FIG. 10. Each FPGA can include one or more FPGA interfaces through which the FPGA is connected to other FPGAs of the emulator (and potentially other emulator hardware components), in order for the FPGAs to exchange signals. An FPGA interface may also be referred to as an input/output pin or an FPGA pad. While some embodiments disclosed herein make use of emulators comprising FPGAs, other embodiments can include other types of logic blocks instead of, or along with, the FPGAs for emulating DUTs, for example, custom FPGAs, specialized ASICs for emulation or prototyping, memories, and input/output devices.

A programmable device may include an array of programmable logic blocks and a hierarchy of reconfigurable interconnects that allow the programmable logic blocks to be connected to each other according to the descriptions in the HDL code. Each of the programmable logic blocks can be configured to perform complex combinational functions, or merely simple logic gates, such as AND, and XOR logic blocks.

In many FPGAs, logic blocks also include memory elements, which may be simple latches, flip-flops or more complex blocks of memory. Depending on the length of the interconnections between different logic blocks, signals may arrive at input terminals of the logic blocks at different times.

Programmable processors $1004_1$-$1004_N$ may be placed into one or more hardware boards $1012_1$ through $1012_M$. Many of such boards may be placed into a hardware unit, e.g. $1014_1$. The boards within a unit may be connected using the backplane of the unit or any other types of connections. In addition, multiple hardware units (e.g., $1014_1$ through $1014_K$) may be connected to each other by cables or any other means to form a multi-unit system. In general, the hardware emulation or prototype system 1002 may be formed using a single board, a single unit with multiple boards, or with multiple units without departing from the teachings of the present disclosure.

For a DUT that is to be emulated, the emulator receives from the host system one or more bit files including a description of the DUT. The bit files further specify partitions of the DUT created by the host system with trace and injection logic, mappings of the partitions to the FPGAs of the emulator, and design constraints. Based on the bit files, the emulator configures the FPGAs to perform the functions of the DUT. With some emulators, one or more FPGAs of an emulator already have the trace and injection logic built into the silicon of the FPGA. For this type of emulator, the FPGAs don't have to be configured by the host system to emulate trace and injection logic.

The host system 110 receives (e.g., from a user or from a data store) a description of a DUT that is to be emulated. In one embodiment, the DUT description is in a hardware description language (HDL), such as register transfer language (RTL). In another embodiment, the DUT description is in netlist level files, or a mix of netlist level files and HDL files. If part of the DUT description or the entire DUT description is in a HDL, the host system synthesizes the DUT description to create a gate level netlist based on the DUT description. A host system can use the netlist of the DUT to partition the DUT into multiple partitions, with some of these partitions including trace and injection logic. The trace and injection logic traces interface signals exchanged via the interfaces of an FPGA. Additionally, the trace and injection logic can be used to inject traced interface signals into the logic of the FPGA. The host system maps each partition to an FPGA of the emulator. With some emulators, the trace and injection logic is only included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic was incorporated, the bit files also describe the incorporation of the logic. The bit files may also include place and route information and design constraints. The host system stores the bit files and also stores for components of the DUT information describing which FPGAs are to emulate each component of the DUT (to which FPGAs each component is mapped).

Upon request, the host system transmits the bit files to the emulator. The host system instructs the emulator to emulate the DUT. During emulation of the DUT or at the end of the emulation, the host system receives emulation results from the emulator through the emulation connection. Emulation results are data and information generated by the emulator based on the emulation of the DUT. The emulation results include interface signals (states of interface signals) traced by the trace and injection logic of each FPGA. The host system can stores the emulation results, or transmit them to another processing system.

After emulation of the DUT, a user may request to debug a component of the DUT. If such a request is made the user may provide a time period of the emulation to debug. The host system identifies which FPGAs are configured to emulate the component based on the stored information. The host system retrieves stored interface signals associated with the time period and traced by the trace and injection logic of each identified FPGA. The host system instructs the emulator to re-emulate the identified FPGAs, either one by one, multiple at a time, or altogether. The host system transmits the retrieved interface signals to the emulator in order to re-emulate the component for the time period. The trace and injection logic of each identified FPGA injects its respective interface signals received from the host system into the logic of the DUT mapped to the FPGA. In case of multiple re-emulations of an FPGA, the results may be merged all together to have a full debug view.

The host system receives from the emulator signals traced by logic of the identified FPGAs during the re-emulation of the component. The host system stores the signals received from the emulator. The signals traced during the re-emulation can have a higher sampling rate than during the initial emulation. For example, in the initial run a traced signal may be comprised of a saved hardware state every X milliseconds. However, in the re-emulation the traced signal may be comprised of a saved hardware state every Y milliseconds, where Y is less than X. If the user requests to view a waveform of a signal traced during the re-emulation, the host system can retrieve the stored signal and display a plot of the signal (generates a waveform of the signal). Afterwards the user can, for example, request to re-emulate the same component but for a different time period or to re-emulate another component.

A host system typically comprises at least seven sub-systems: a design synthesizer, a mapping module, a run time module, a results module, a debug module, a waveform module, and a storage module. Each of these sub-systems may be embodied as hardware, software, firmware, or a combination thereof. Together these components configure the emulator, and monitor the emulation results.

The design synthesizer converts the HDL of a DUT into gate level logic. For a DUT that is to be emulated, the design synthesizer receives a description of the DUT. If the description of the DUT is fully or partially in HDL (e.g., RTL or other level of abstraction), the design synthesizer 1010 synthesizes the HDL of the DUT to create a gate-level netlist with a description of the DUT in terms of gate level logic.

The mapping module partitions DUTs and maps partitions to emulator FPGAs. The mapping module partitions a DUT at the gate level into a number of partitions using the netlist of the DUT. For each partition, the mapping module retrieves a gate level description of the trace and injection logic and incorporates the logic into the partition. As described above, the trace and injection logic included in a partition is configured to trace signals exchanged via the interfaces of an FPGA to which the partition is mapped (trace interface signals). The trace and injection logic can be incorporated into the DUT prior to the partitioning. For example, the trace and injection logic may be incorporated by the design synthesizer prior to or after the synthesizing the HDL of the DUT. Hence, the trace and injection logic may not match the partitions, it may be a subset, a superset or even different from the partitions.

In addition to including the trace and injection logic, the mapping module may include additional tracing logic in a partition in order to trace the states of certain DUT components that are not traced by the trace and injection logic (to trace signals other than the interface signals traced by the trace and injection logic). The mapping module may include the additional tracing logic in the DUT prior to the partitioning or in partitions after the partitioning. The design synthesizer can include the additional tracing logic in an HDL description of the DUT prior to synthesizing the description.

The mapping module maps each partition of the DUT to an FPGA of the emulator. The mapping module performs the partitioning and mapping using design rules, design constraints (e.g., timing or logic constraints), and information about the emulator. For components of the DUT, the mapping module stores information in the storage module describing which FPGAs are to emulate each component.

Based on the partitioning and the mapping, the mapping module generates one or more bit files that describe the created partitions and the mapping of logic to each FPGA of the emulator. The bit files may include additional information, such as constraints of the DUT, and routing information of connections between FPGAs and connections within each FPGA. The mapping module can generate a bit file for each partition of the DUT, which can be stored in the storage module. Upon request from a user, the mapping module transmits the bit files to the emulator, which the emulator uses to configure the FPGAs to emulate the DUT.

If the emulator includes specialized ASICs that include the trace and injection logic, the mapping module may generate a specific configuration allowing to connect them to the DUT or just save the information of what traced/injected signal is and where the information is stored on the specialized ASIC.

The run time module controls emulations performed on the emulator. The run time module may cause the emulator to start or stop executing an emulation. Additionally, the run time module may provide input signals/data to the emulator. The input signals may be provided directly to the emulator through the connection or indirectly through other input signal devices. For example, the host system with the run time module may control an input signal device to provide the input signals to the emulator. The input signal device may be, for example, a test board (directly or through cables), signal generator, another emulator, or another host system.

The results module processes emulation results generated by the emulator. During emulation and/or after completing the emulation, the results module receives emulation results from the emulator generated during the emulation. The emulation results include signals traced during the emulation. Specifically, the emulation results include interface signals traced by the trace and injection logic emulated by each FPGA. The emulation results may also include signals traced by additional logic included in the DUT. Each traced signal can span multiple cycles of the emulation. A traced signal is comprised of multiple hardware states and each hardware state is associated with a time of the emulation. The results module stores the traced signals received in the storage module. For each stored signal, the results module can store information indicating which FPGA generated the traced signal.

The debug module allows users to debug DUT components. After the emulator has emulated a DUT and the results module has received the interface signals traced by the trace and injection logic during the emulation, a user may request to debug a component of the DUT by re-emulating the component for a specific time period. In a request to debug a component, the user identifies the components and indicates a time period of the emulation to debug. The user's request can also include a sampling rate that indicates how often hardware states should be saved by logic that traces signals.

The debug module identifies the one or more FPGAs of the emulator that are configured to emulate the component based on the information stored by the mapping module in the storage module. For each identified FPGA, the debug module retrieves, from the storage module, interface signals traced by the trace and injection logic of the FPGA during the time period indicated by the user (i.e., retrieve hardware states traced by the trace and injection logic that are associated with the time period).

The debug module transmits the retrieved interface signals to the emulator. The debug module instructs the debug module to run the identified FPGAs and for the trace and injection logic of each identified FPGA to inject its respective traced signals into logic of the FPGA in order to re-emulate the component for the requested time period. The debug module can also transmit the sampling rate provided by the user to the emulator so that the tracing logic traces hardware states at the proper intervals.

To debug the component, the emulator only has to run the FPGAs to which the component has been mapped. Additionally, the re-emulation of the component does not have to start from the beginning but can start at any point desired by the user.

For an identified FPGA, the debug module can transmit instructions to the emulator to load multiple emulator FPGAs with the same configuration of the identified FPGA. The debug module additionally instructs the emulator to run the multiple FPGAs in parallel. Each FPGA from the multiple FPGAs is run with a different time window of the interface signals in order to generate a larger time window in a shorter amount of time. For example, for the identified FPGA to run a certain amount of cycles it may take an hour. However, if multiple FPGAs are loaded with the configuration of the identified FPGA and each of the FPGAs runs a subset of the cycles, it may only take a few minutes for the FPGAs to collectively run all of the cycles.

A user may identify a hierarchy or a list of DUT signals to re-emulate. To enable this, the debug module determines the FPGA needed to emulate the hierarchy or list of signals, retrieves the necessary interface signals and transmits the retrieved interface signals to the emulator for re-emulation. Hence, a user can identify any element (e.g., component or signal) of the DUT to debug/re-emulate.

The waveform module generates waveforms based on traced signals. If a user requests to view a waveform of a signal traced during an emulation run, the host system retrieves the signal from the storage module. The waveform module displays a plot of the signal to the user. For one or more signals, when the signals are received from the emulator, the waveform module can automatically generate the plots of the signals.

Conclusion

Based on the teachings contained in this disclosure, it may be apparent to persons skilled in the relevant art(s) how to make and use embodiments of this disclosure using data processing devices, computer systems and/or computer architectures other than that shown in FIG. 7. In particular, embodiments may operate with software, hardware, and/or operating system implementations other than those described herein.

It is to be appreciated that the Detailed Description section, and not any other section, is intended to be used to interpret the claims. Other sections may set forth one or more but not all exemplary embodiments as contemplated by the inventor(s), and thus, are not intended to limit this disclosure or the appended claims in any way. The Detailed Description and any corresponding figures may signify, only to provide knowledge and understanding, the claimed inventions. To minimize the length of the Detailed Description, while various features, structures or characteristics may be described together in a single embodiment, they also can be used in other embodiments without being written about. Variations of any of these elements, and modules, processes, machines, systems, manufactures or compositions disclosed by such embodiments and/or examples are easily used in commerce. The Detailed Description and any corresponding figures may signify, implicitly or explicitly, advantages and improvements of the claimed inventions and their embodiments for use in commerce.

While this disclosure describes exemplary embodiments for exemplary fields and applications, it should be understood that the disclosure is not limited thereto. Other embodiments and modifications thereto are possible, and are within the scope and spirit of this disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries may be defined as long as the specified functions and relationships (or equivalents thereof) are appropriately performed. Also, alternative embodiments may perform functional blocks, steps, operations, methods, etc. using orderings different from those described herein.

References herein to "one embodiment," "an embodiment," "an example embodiment," "some embodiments," or similar phrases, indicate that the embodiment described may include a particular feature, structure, or characteristic, but every embodiment may not necessarily include the particular feature, structure, or characteristic. Moreover, such phrases are not necessarily referring to the same embodiment.

Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein. Additionally, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

The breadth and scope of this disclosure should not be limited by any of the above-described exemplary embodiments, but should be defined only in accordance with the following claims and their equivalents.

What is claimed:

1. A method, comprising:
generating a structure of a power and ground (PG) network based on a circuit specification received as input;
identifying a violation of a design rule for the structure;
changing at least a portion of the structure to remove the violation of the design rule;
generating a report of the violation and corresponding information of the changed portion of the structure;
generating an object based on the changed portion of the structure; and
outputting the report and the object overlaying on the structure.

2. The method of claim 1, further comprising receiving input from a user to remove an additional violation of the design rule based on the report and the object.

3. The method of claim 1, further comprising:
identifying the structure as design rule check (DRC) clean;
storing the structure in a database; and
creating a layout, using the structure, wherein the layout comprises a representation of the PG network.

4. The method of claim 1, wherein generating a structure comprises generating a wire, further comprising:
repeating the identifying, the changing, and the generating for a predetermined number of iterations;
identifying an additional violation of an additional design rule for the wire;

removing the wire from the PG network;
generating an additional report of the additional violation and the removed wire; and
generating an additional wire based on the removed wire.

5. The method of claim 4, further comprising:
generating reports of violations and modifications for each iteration of the predetermined number of iterations respectively;
generating additional wires based on the reports of violations respectively;
determining a number of the additional wires overlapping with the wire; and
merging the number of the additional wires.

6. The method of claim 1, wherein generating the structure comprises generating a via, further comprising:
determining whether the via is fixable based on the circuit specification and the design rule;
in response to a determination that the via is unfixable, removing the via from the PG network; and
generating the report of the violation and the removed via.

7. The method of claim 6, further comprising:
in response to a determination that the via is fixable, changing the via to remove the violation of the design rule;
repeating the identifying, the determining, and the changing for a predetermined number of iterations;
identifying an additional violation of an additional design rule for the via;
removing the via from the PG network;
generating an additional report of the additional violation and the removed via; and
generating an additional via based on the removed via.

8. A system, comprising:
a memory configured to store operations; and
one of more processors configured to perform the operations, the operations comprising:
generating a structure of a power and ground (PG) network based on a circuit specification received as input;
identifying a violation of a design rule for the structure;
changing at least a portion of the structure to remove the violation of the design rule;
generating a report of the violation and corresponding information of the changed portion of the structure;
generating an object based on the changed portion of the structure; and
outputting the report and the object overlaying on the structure.

9. The system of claim 8, the operations further comprising receiving input from a user to remove an additional violation of the design rule based on the report and the object.

10. The system of claim 8, the operations further comprising:
identifying the structure as design rule check (DRC) clean;
storing the structure in a database; and
creating a layout, using the structure, wherein the layout comprises a representation of the PG network.

11. The system of claim 8, wherein generating the structure comprises generating a wire, the operations further comprising:
repeating the identifying, the changing, and the generating for a predetermined number of iterations;
identifying an additional violation of an additional design rule for the wire;
removing the wire from the PG network;
generating an additional report of the additional violation and the removed wire; and
generating an additional wire based on the removed wire.

12. The system of claim 11, the operations further comprising:
generating reports of violations and modifications for each iteration of the predetermined number of iterations respectively;
generating additional wires based on the reports of violations respectively;
determining a number of the additional wires overlapping with the wire; and
merging the number of the additional wires.

13. The system of claim 8, wherein generating the structure comprises generating a via, the operations further comprising:
determining whether the via is fixable based on the circuit specification and the design rule;
in response to a determination that the via is unfixable, removing the via from the PG network; and
generating the report of the violation and the removed via.

14. The system of claim 13, the operations further comprising:
in response to a determination that the via is fixable, changing the via to remove the violation of the design rule;
repeating the identifying, the determining, and the changing for a predetermined number of iterations;
identifying an additional violation of an additional design rule for the via;
removing the via from the PG network;
generating an additional report of the additional violation and the removed via; and
generating an additional via based on the removed via.

15. A non-transitory, tangible computer-readable storage device having instructions stored thereon that, when executed by at least one computing device, cause the at least one computing device to perform operations comprising:
generating a structure of a power and ground (PG) network based on a circuit specification received as input;
identifying a violation of a design rule for the structure;
changing at least a portion of the structure to remove the violation of the design rule;
generating a report of the violation and corresponding information of the changed portion of the structure;
generating an object based on the changed portion of the structure; and
outputting the report and the object overlaying on the structure.

16. The non-transitory, tangible computer-readable storage device of claim 15, the at least one computing device performing operations further comprising receiving input from a user to remove an additional violation of the design rule based on the report and the object.

17. The non-transitory, tangible computer-readable device of claim 15, the at least one computing device performing operations further comprising:
identifying the structure as design rule check (DRC) clean;
storing the structure in a database; and
creating a layout, using the structure, wherein the layout comprises a representation of the PG network.

18. The non-transitory, tangible computer-readable device storage of claim 15, wherein generating the structure comprises generating a wire, the at least one computing device performing operations further comprising:

repeating the identifying, the changing, and the generating for a predetermined number of iterations;

identifying an additional violation of an additional design rule for the wire;

removing the wire from the PG network;

generating an additional report of the additional violation and the removed wire; and generating an additional wire based on the removed wire.

19. The non-transitory, tangible computer-readable device storage of claim 15, wherein generating the structure comprises generating a via, the at least one computing device performing operations further comprising:

determining whether the via is fixable based on the circuit specification and the design rule;

in response to a determination that the via is unfixable, removing the via from the PG network; and generating the report of the violation and the removed via.

20. The non-transitory, tangible computer-readable device storage of claim 19, the at least one computing device performing operations further comprising:

in response to a determination that the via is fixable, changing the via to remove the violation of the design rule;

repeating the identifying, the determining, and the changing for a predetermined number of iterations;

identifying an additional violation of an additional design rule for the via;

removing the via from the PG network;

generating an additional report of the additional violation and the removed via; and generating an additional via based on the removed via.

* * * * *